(12) United States Patent
Yi

(10) Patent No.: US 6,783,801 B2
(45) Date of Patent: Aug. 31, 2004

(54) METHODS FOR MAKING A PASTE OF MATERIALS TO FORM BUMPS FOR SCREEN PRINT PROCESSES

(75) Inventor: Sang-Don Yi, Seoul (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 10/346,280

(22) Filed: Jan. 17, 2003

(65) Prior Publication Data

US 2003/0153174 A1 Aug. 14, 2003

(30) Foreign Application Priority Data

Feb. 8, 2002 (KR) .......................................... 2002-7296

(51) Int. Cl.[7] ................................................ B05D 3/12
(52) U.S. Cl. ...................................... 427/264; 428/457
(58) Field of Search ................... 427/11, 142, 191–192, 427/201, 264, 271, 404; 428/457, 480, 500, 553, 558–600, 648, 687, 689

(56) References Cited

U.S. PATENT DOCUMENTS

| 4,358,884 A | | 11/1982 | Harvey et al. ............ 29/402.18 |
| 5,549,927 A | * | 8/1996 | Cottone et al. .............. 427/191 |
| 6,505,673 B1 | * | 1/2003 | Abuaf et al. ................... 164/45 |
| 6,589,600 B1 | * | 7/2003 | Hasz et al. .................. 427/264 |

* cited by examiner

*Primary Examiner*—David Nelms
*Assistant Examiner*—David Vu
(74) *Attorney, Agent, or Firm*—Mills & Onello LLP

(57) ABSTRACT

Methods of making a paste of materials used in forming bumps for semiconductor applications wherein the distribution of trace elements is substantially uniform are provided. The methods of making a paste for a semiconductor package process comprises heating and fusing several materials to alloy the materials, rapidly cooling the fused alloy composition to improve conformity of the composition, processing the cooled alloy composition into a fine powder, and processing the alloy powder to be a paste-shape.

24 Claims, 5 Drawing Sheets

Fig. 1

|  | Cost | Through-put | Materials |
|---|---|---|---|
| e-beam evaporation | High | Low | Unimited |
| electroplate | Medium | Medium | Limited |
| electroless | Low | Low | Limited |
| screen print | Low | High | Limited |
| ball placement | Low | High | Limited |

Fig. 2

| Known Composition | Melting Temperature | Known Composition | Melting Temperature |
|---|---|---|---|
| 63Sn/37Pb | 183°C | 95.5Sn/3.5AG/1Zn | 217°C |
| 95Pb/5Sn | 315°C | 77.2Sn/20In/2.8Ag | 178°C |
| 99Sn/1Sb | 235°C | >90Sn/<8InAg | 195°C |
| 95Sn/5Sb | 232-240°C | 86Sn/5In/9Zn | 173-193°C |
| 96.5Sn/3.5Ag | 221°C | 85.9Sn/7.4In/6.7Zn | 182.3-188.9°C |
| 95Sn/5Ag | 221-240°C | 95Sn/4.75Cu/0.25Se | 210-217°C |
| 58Bi/42Sn | 138°C | 88Sn/4Sb/8Zn | 198-204°C |
| 48Sn/52In | 138°C | 95.9Sn/1Bi/0.1Ag/3Cu | 206-223°C |
| 99.3Sn/0.7Cu | 227°C | 90Sn/7.5Bi/2Ag/0.5Cu | 207-212°C |
| 92Sn/8Zn | 199°C | 96.2Sn/2.5Ag/0.5Sb/0.8Cu | 210-216°C |
| 83.5Sn/14Bi/2.5Ag | 142-218°C | 93.5Sn/1.5Ag/4Bi/1Zn | 201.4-228.5°C |
| 91.8Sn/4.8Bi/3.4Ag | 221°C | 91.5Sn/1.5Ag/6Bi/1Zn | 192.2-225.2°C |
| 94Sn/4Bi/2Ag | 203.6-231.1°C | 93Sn/2Ag/4Bi/1Zn | 189.6-226.7°C |
| 92.5Sn/6Bi/1.5Ag | 187.6-228.9°C | 91Sn/Ag/Bi/Zn | 185-225.2°C |
| 75Sn/19Bi/6Sb | 140-220°C | 89.5Sn/1.5Ag/7Bi/2Zn | 190.4-223.4°C |
| 70Sn/20Bi/10In | 143-193°C | 90Sn/0.2Ag/4.5Bi/5Sb | 228-234°C |
| 80Sn/10Bi/10In | 163-209°C | 95.5Sn/0.2Ag/4.5Bi/5Sb | 288-377°C |
| 78Sn/16Bi/6Zn | 134-196°C | 96.5Sn/1Ag/0.5Sb/2Zn | 199-220°C |
| 41/7Sn/57Bi/1.3Zn | 127°C | 94.5Sn/1Ag/3Sb/1.5Zn | 199-227°C |
| 93.6Sn/57Bi/1.7Cu | 216°C | 82Sn/6Zn/6In/6Bi | 177-185°C |
| 95.5Sn/3.9Ag/0.6Cu | 218°C | 84Sn/6Zn/5In/1Bi | 182-188°C |
| 96.7Sn/1.25Ag/2Cu | 224-260°C | 90Sn/5Zn/4In/1Bi | 190-192°C |
| 96.5Sn/0.5Ag/3Cu | 225-296°C | 92.8Sn/0.7Cu/6In/0.5Ga | 210-215°C |
| 95.65Sn/0.35Ag/4Cu | 227-332°C | 93Sn/0.5Cu/6In/0.5Ga | 209-214°C |
| 94.75Sn/1.25Ag/4Cu | 224-260°C | | |

METHODS FOR MAKING A PASTE OF MATERIALS TO FORM BUMPS FOR SCREEN PRINT PROCESSES

RELATED APPLICATION

This application relies for priority upon Korean Patent Application No. 2002-07296, filed on Feb. 8, 2002, the contents of which are herein incorporated by reference in their entirety.

FIELD OF THE INVENTION

The present invention relates to methods for making a paste of materials used to form semiconductor "bumps" or surface irregularities as part of a semiconductor package process. More specifically, the present invention relates to methods for making a composition or paste of materials used to form bumps wherein trace elements, namely those present in amounts less than about 10% by weight, have a substantially uniform, homogeneous distribution, throughout the paste.

BACKGROUND OF THE INVENTION

Semiconductor devices have been rapidly miniaturized and their performance has been highly improved along with developments in silicon processing techniques. Thus, even in the field of semiconductor package techniques, flip chip package techniques have been introduced so that high-performance miniaturized devices are effectively packaged, and the applications for such flip chip package techniques have gradually increased.

However, in case of known flip chip package techniques, extensive studies have been made of methods of forming bumps for purposes of increasing throughput and lowering costs while maintaining high quality standards.

Conventional techniques for forming "bumps" on semiconductor chips include e-beam evaporation, electroplating, electroless-plating, screen print, ball placement, and the like. These several methods have their own various advantages and disadvantages, as summarized in the table of FIG. 1.

Referring to the table of FIG. 1 and the table of FIG. 2, in the cases where a paste is composed of materials, one or more of which is present in trace amounts of less than about 10 wt. %, the most widely used method of forming bumps is that the desired materials are deposited using electroplating without loss. Although the electroplating method has the advantage of forming bumps with a fine pitch, it also has the disadvantage of causing low throughput. In addition, considerable know-how is required to successfully practice this method because there are many variable control parameters involved in composition control. Furthermore, when a bump is to be composed of single or binary components, such bump may be formed by a one-time deposition process. But, if a ternary bump composition is required, or a bump composition with more than three components, the throughput becomes very low because the deposition process must be repeated two or more times.

Based on low costs and high throughput, the screen print process or the ball placement process would ordinarily be the best method of forming multi-component bumps. However, the ball placement technique is possible only when a ball size is 300 μm or more because a flip chip process has a restriction on pitches of balls.

In a successful screen print process, on the other hand, bumps can be formed only when the composition being used consists of 63Sn/37Pb. As lead-free products have recently attracted considerable attention as part of the trend toward environmentally-friendly manufacturing, it has become undesirable to use a lead-based paste to make bumps using the screen print process. This is also the case because bump compositions typically contain trace elements of less than 10 wt. % of the overall composition as illustrated in the table of FIG. 2 wherein the numbers refer to wt. % of each component of the known compositions.

As mentioned above, one of the easiest and least expensive ways of forming bumps is to use the screen print process. However, if the bump compositions contain components in trace amounts, it is virtually impossible to conformally mix powders to obtain a substantially uniform, homogeneous paste. Thus, according to a conventional method of making a paste for forming bumps, a paste is prepared by mixing powders of the components desired for constituting the bumps including the step of kneading the mixed powders with resin or flux to facilitate mixing. In this case, however, the distribution of trace elements in the mixed powders may become non-conformal. This results in low reliability and consistency of the resulting semiconductor products.

SUMMARY OF THE INVENTION

It is a feature of the present invention to provide methods of making a paste of multiple components used to form bumps for a semiconductor package process, which methods make it possible to form an alloy powder in which distribution of trace elements is substantially conformal.

It is another feature of the present invention to provide methods of making a paste of multiple components used to form bumps for a semiconductor package process, which methods make it possible to form substantially conformal bumps of a desired composition using a screen print process.

The objects of the present invention can be achieved by methods of making a paste of multiple components used to form bumps for a semiconductor package process comprising at least the steps of heating and fusing the component materials to form a fused alloy of the materials. The methods may further comprise the step of rapidly cooling the fused alloy to improve conformity of the resulting composition. In a further step, the cooled alloy composition may then be processed into a fine powder. Such alloy powder may be processed to be a paste-shape.

In the present invention, each of the materials, elements, or components of the alloy is preferably heated with the use of a separate furnace. The methods of this invention further comprise in another preferred embodiment alloying the materials, each of which has been fused with the use of a separate furnace, with the use of a mixing furnace to blend the components in the fused state.

In another embodiment of this invention, the materials are fused with the use of a single heating furnace to cause the components to be alloyed. In a further embodiment of this invention, the process for making the cooled alloy composition into a powder comprises an arc discharging step and/or a crushing step.

In another embodiment, the step of rapidly cooling the alloy composition comprises a first cooling step and a second cooling step. In the first cooling step, the fused alloy composition is slowly cooled to a first cooled temperature that is at or slightly higher than the melting point of the alloy composition but lower than melting points of each of the several separate component materials. In the second cooling step, the partially-cooled alloy composition is rapidly cooled from the first cooled temperature to a second cooled temperature which is at or below the melting point of the alloy composition. The step of rapidly cooling the alloy composition from the first cooled temperature to the second cooled temperature is preferably carried out in a vacuum state and/or in an inert gas ambient condition in order to prevent oxidization of the alloy composition. The earlier step of fusing the component materials may also preferably be carried out in a vacuum state and/or in an inert gas ambient condition in order to prevent oxidization of the component materials or possible contamination caused by impurities in the surrounding environment.

It will be understood that this invention may be embodied in different forms and should not be construed as limited to the specific embodiments set forth herein. Rather, the several embodiments herein described are merely illustrative of the invention, and the full scope of the invention will be apparent to those skilled in the art. In the drawings, the thickness of layers and regions are exaggerated for clarity.

BRIEF DESCRIPTION OF THE DRAWINGS

Additional objects and advantages of the present invention will be more readily apparent from the following detailed description of preferred embodiments thereof when taken together with the accompanying drawings in which:

FIG. 1 is a table summarizing certain advantages and disadvantages of alternative conventional techniques of forming bumps;

FIG. 2 is a table of different alloy compositions which could be used to form bumps along with the melting points of those alloy compositions;

DESCRIPTION OF THE PREFERRED EMBODIMENTS

Figure 3:
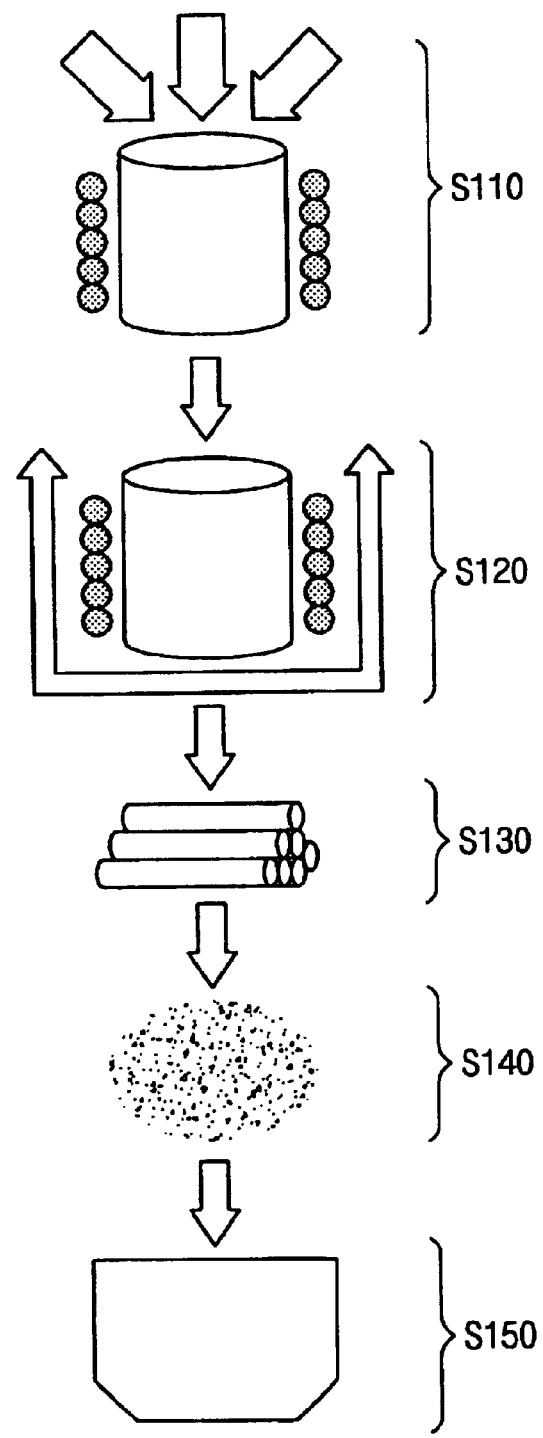
FIG. 3 is a schematic illustration of a method of making a paste of bumps according to a first preferred embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Referring to FIG. 3, a method of making a paste of materials used to form bumps for a semiconductor package process according to a first preferred embodiment of the present invention comprises a first step of fusing and alloying the desired component materials (S110), followed by the subsequent steps of cooling rapidly the fused alloy composition (S120), making the alloy composition into a solid (S130), processing the solid alloy composition into a fine powder (S140), and processing the fine powder alloy composition into a paste (S150).

Figure 4:
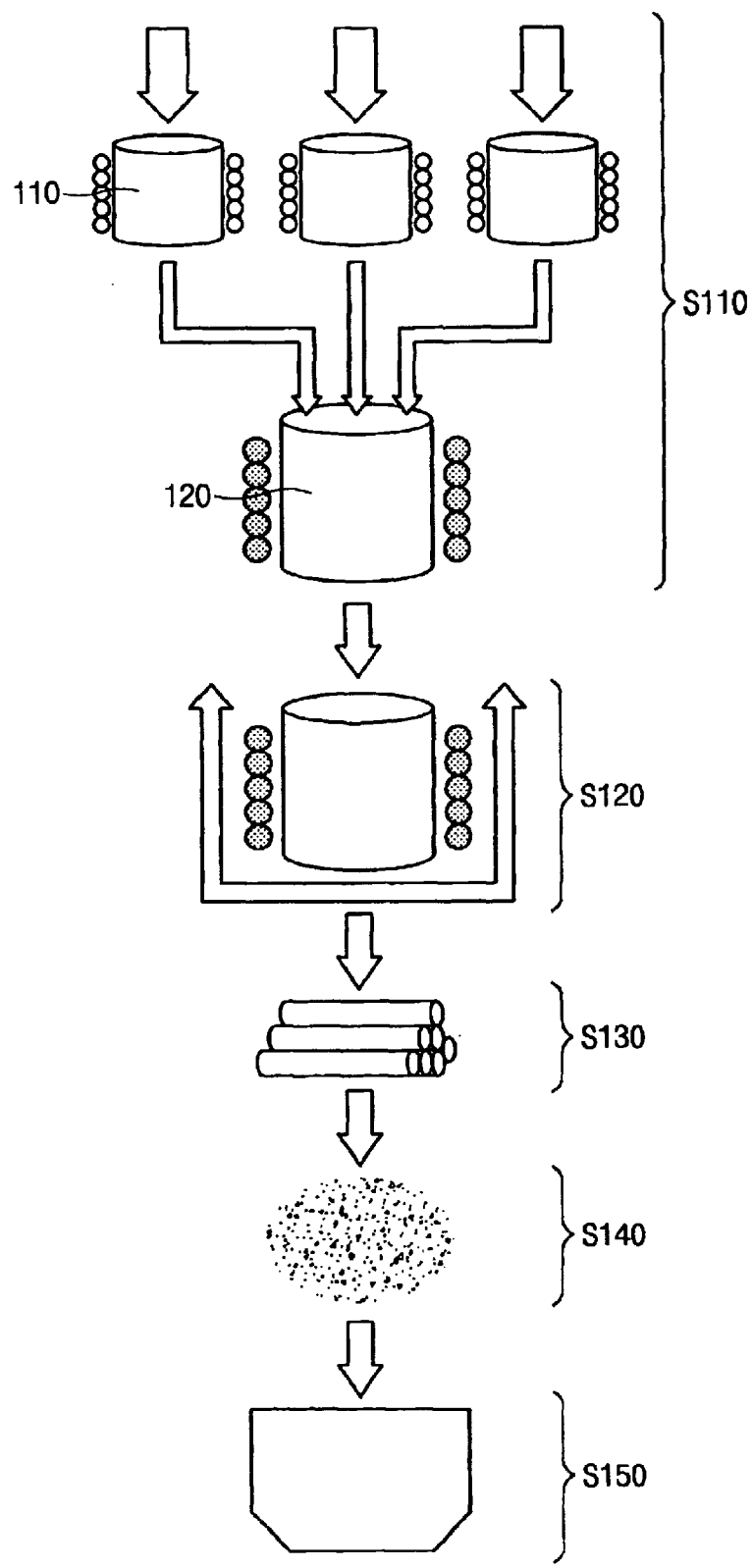
FIG. 4 is a schematic illustration of a method of making a paste of bumps according to an alternative preferred embodiment of the present invention.

As illustrated in FIG. 3, the component materials may be placed in a single heating, fusing and mixing furnace from the beginning where they are fused and alloyed (S110) at a temperature sufficiently high for melting and alloying the component materials. Alternatively, as illustrated in FIG. 4, after heating and fusing each of the component materials with the use several individual component furnaces 110, the fused component materials are placed in a mixing furnace 120. Furnace 120 is heated to a slightly higher temperature than the melting point of the mixed component materials, and the melted materials are mixed to form a fused alloy.

The resulting alloy composition from step S110 of either FIG. 3 or FIG. 4 is then rapidly cooled (step S120) to form an alloy composition having a high degree of conformity. The step of cooling the alloy composition is preferably divided into a first cooling step and a second cooling step. To begin with, in the first cooling step, the alloy composition is slowly cooled to a temperature which is at or somewhat higher than the melting point of the alloy composition but lower than the melting points of the separate component materials. In the second cooling step, the alloy composition is rapidly cooled to a temperature which is at or below the melting point of the alloy composition. In this part of the cooling operation, the alloy composition is preferably cooled using cooling water. In step S130 the rapidly cooled alloy composition is formed into one or more rod-shapes or other lump-shapes. The lump-shaped alloy composition is then processed into a fine powder, for example by an arc discharging process, a crushing process, or the like (S140). Finally, the alloy powder is kneaded with a suitable resin or flux to make a paste (S150) suitable for forming bumps using a screen print process.

Figure 5:
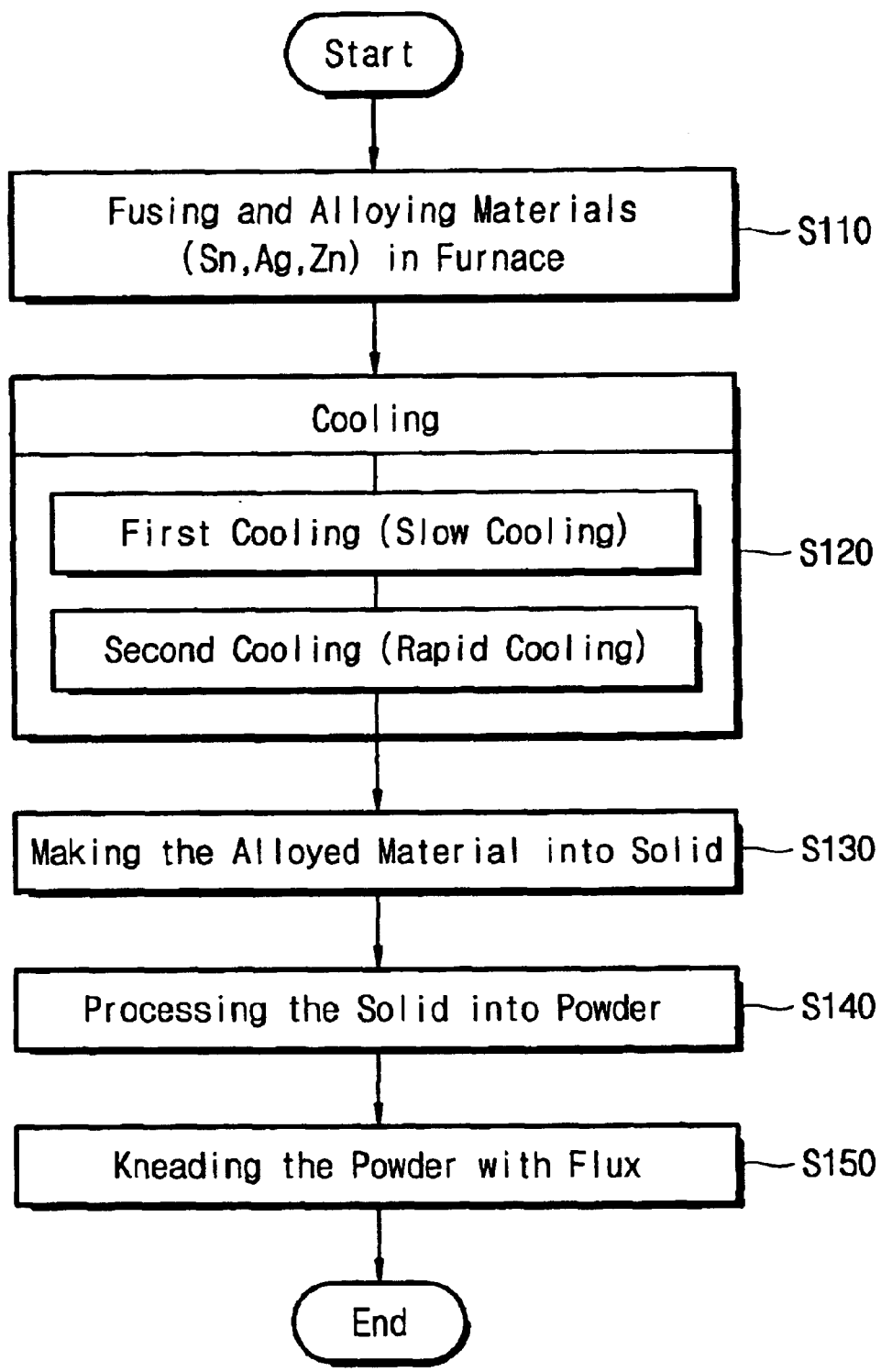
FIG. 5 is a process flowchart illustrating the several steps of a method of making a paste of bumps according to a preferred embodiment of the present invention.

Referring to FIG. 5, a method of making a paste having the composition of 95.5 wt. % Sn/3.5 wt. % Ag/1 wt. % Zn will be described as an example of this invention. To begin with, the separate component materials in the desired proportions are put in a mixing furnace. The temperature of the fusing/mixing furnace is raised to 960° C. or higher to fuse the materials. At this time, the temperature of the mixing furnace is set to be higher than the melting point of Ag, which has the highest melting point of the three components. The interior of the mixing furnace is heated in a vacuum state or an inert gas ambient atmosphere. For reference, the recognized melting points of Ag, Sn, and Zn are 960° C., 231° C., and 419° C., respectively. The three component materials are fused and alloyed in the fusing/mixing furnace (S110) to form an alloy composition.

Next, the alloy composition is subjected to a cooling process S120. The fused alloy composition is first slowly cooled to about 220° C., which is about or slightly above the melting point of the alloy composition. The fused alloy is then rapidly cooled to a temperature below 220° C. Here, the cooling process is preferably performed in a vacuum state or an inert gas ambient so as to prevent oxidization of the alloy composition or contamination caused by impurities. It has been found as part of this invention that by rapidly cooling the fused alloy composition, an alloy composition is formed having a high degree of conformity.

Next, the rapidly cooled alloy composition is formed into a solid lump-shape (S130). The lump-shaped alloy composition is then processed into a fine powder by an arc discharging process or a crushing method (S140). The fine alloy powder is then kneaded with flux (S150) to make a paste in accordance with this invention.

As described above, a method of forming a paste of materials used for forming semiconductor bumps according to the present invention results in unexpectedly superior uniformity of an alloy composition containing trace elements. As a result, a paste made by the methods of the present invention is capable of forming conformal bumps of desired composition through a screen print process resulting in consistent, uniform, high-quality semiconductor products. In summary, if the present invention is applied, it is capable of making a powder in which the distribution of trace elements is substantially uniform. In addition, uniform bumps of desired composition can be formed through a screen print process.

While the present invention has been described in connection with specific and preferred embodiments thereof, it is capable of various changes and modifications without departing from the spirit and scope of the invention, and all such variations are considered to be within the scope of this invention.

Having described the invention, what is claimed is:

1. A method of preparing a paste of two or more component materials to form bumps for a semiconductor package process, the method comprising the steps of:
    (a) heating, fusing and mixing the component materials to form an alloy composition of the materials;
    (b) rapidly cooling the alloy composition to form a cooled alloy composition having a high degree of conformity;
    (c) processing the cooled alloy composition to form a solid;
    (d) processing the solid alloy composition into a fine alloy powder; and,
    (e) processing the alloy powder into a paste.

2. The method as claimed in claim 1, further wherein the component materials are heated and fused in separate component furnaces.

3. The method as claimed in claim 2, further comprising the steps of mixing and alloying the fused component materials from the separate component furnaces in a component mixing furnace.

4. The method as claimed in claim 1, wherein the component materials are mixed, fused and alloyed in a single heating and mixing furnace.

5. The method as claimed in claim 1, wherein the step of processing the cooled alloy composition into a powder comprises an arc discharging or crushing method.

6. The method as claimed in claim 1, wherein the step of rapidly cooling the alloy composition comprises a first cooling step in which the alloy composition is slowly cooled to a first cooled temperature which is at or higher than the melting point of the alloy composition but lower than the melting points of the component materials to form a partially-cooled alloy composition, and a second cooling step in which the partially-cooled alloy composition is then rapidly cooled to a second cooled temperature which is at or below the melting point of the alloy composition.

7. The method as claimed in claim 1, wherein the step of rapidly cooling the alloy composition is carried out in a vacuum state or in an inert gas ambient atmosphere to prevent oxidization.

8. The method as claimed in claim 1, wherein the step of heating, fusing and mixing the component materials to form an alloy composition is carried out in a vacuum state or an inert gas ambient atmosphere to prevent oxidization of the component materials and contamination caused by impurities.

9. The method as claimed in claim 1, wherein the step of processing the alloy powder into a paste comprises kneading the powder with a suitable resin or flux to make a paste.

10. The method as claimed in claim 1, wherein said alloy composition comprises three or more component materials.

11. The method as claimed in claim 1, wherein one of said component materials is present in a trace amount of less than about 10% by weight.

12. The method as claimed in claim 10, wherein one of said component materials is present in a trace amount of less than about 10% by weight.

13. A semiconductor chip comprising one or more bumps consisting essentially of two or more component materials applied thereon, said bumps being formed by the steps of:
    (1) heating, fusing and mixing the component materials to form an alloy composition of the materials;
    (2) rapidly cooling the alloy composition to form a cooled alloy composition having a high degree of conformity;
    (3) processing the cooled alloy composition to form a solid;
    (4) processing the solid alloy composition into a fine alloy powder;
    (5) processing the alloy powder into a paste; and,
    (6) applying the paste to a semiconductor chip using a screen print process.

14. A semiconductor chip as claimed in claim 13, further wherein the component material are heated and fused in separate component furnaces.

15. A semiconductor chip as claimed in claim 14, further comprising the steps of mixing and alloying the fused component material from the separate component furnaces in a component mixing furnace.

16. A semiconductor chip as claimed in claim 13, wherein the component materials are mixed, fused and alloyed in a single heating and mixing furnace.

17. A semiconductor chip as claimed in claim 13, wherein the step of processing the cooled alloy composition into a powder comprises an arc discharging or crushing method.

18. A semiconductor chip as claimed in claim 13, wherein the step of rapidly cooling the alloy composition comprises a first cooling step in which the alloy composition is slowly cooled to a first cooled temperature which is at or higher than the melting point of the alloy composition but lower than the melting points of the component materials to form a partially-cooled alloy composition, and a second cooling step in which the partially-cooled alloy composition is then rapidly cooled to a second cooled temperature which is at or below the melting point of the alloy composition.

19. A semiconductor chip as claimed in claim 13, wherein the step of rapidly cooling the alloy composition is carried out in a vacuum state or in an inert gas ambient atmosphere to prevent oxidization.

20. A semiconductor chip as claimed in claim 13, wherein the step of heating, fusing and mixing the component materials to form an alloy composition is carried out in a vacuum state or an inert gas ambient atmosphere to prevent oxidization of the component materials and contamination caused by impurities.

21. A semiconductor chip as claimed in claim 13, wherein the step of processing the alloy powder into a paste comprises kneading the powder with a suitable resin or flux to make a paste.

22. A semiconductor chip as claimed in claim 13, wherein said alloy composition comprises three or more component materials.

23. A semiconductor chip as claimed in claim 13, wherein one of said component materials is present in a trace amount of less than about 10% by weight.

24. A semiconductor chip as claimed in claim 22, wherein one of said component materials is present in a trace amount of less than about 10% by weight.

* * * * *